United States Patent [19]

Cochrane et al.

[11] Patent Number: 5,721,670

[45] Date of Patent: Feb. 24, 1998

[54] ELECTRONIC EQUIPMENT HAVING AIR FLOW COOLING PASSAGES

[75] Inventors: Paul D. Cochrane; Lee J. Racicot; M. Scott MacKenzie, all of Nepean, Canada

[73] Assignee: Northern Telecom Limited, Montreal, Canada

[21] Appl. No.: 575,375

[22] Filed: Dec. 21, 1995

[51] Int. Cl.[6] .................................................. H05K 7/20
[52] U.S. Cl. .......................... 361/695; 165/80.3; 312/236; 415/213.1; 454/184
[58] Field of Search .................................. 361/687, 690, 361/694, 695, 796, 831; 312/223.1, 236; 415/115, 177, 178, 283, 213.1, 214.1; 416/223 R; 174/16.1; 310/68 CD; 454/184; 165/80.3, 121–126

[56] References Cited

U.S. PATENT DOCUMENTS

| | | | |
|---|---|---|---|
| 4,744,005 | 5/1988 | Milani | 361/384 |
| 5,087,932 | 2/1992 | Chickano | 346/145 |
| 5,136,468 | 8/1992 | Wong | 361/393 |
| 5,308,156 | 5/1994 | Gutierrez | 312/236 |
| 5,338,214 | 8/1994 | Steffes | 439/160 |
| 5,477,029 | 12/1995 | Skatt | 219/390 |
| 5,562,410 | 10/1996 | Sacks | 415/213.1 |

*Primary Examiner*—Gerald P. Tolin
*Attorney, Agent, or Firm*—R. J. Austin

[57] ABSTRACT

Electronic equipment having a fan cooling arrangement with a fan structure mounted at the rear of the housing. The fan structure is mounted vertically in operational position. An access opening at the front of the housing is of lesser height than the fan structure. It is desired to withdraw the fan structure from the housing through the restricted access opening. For this purpose, the fan structure is pivotally mounted to a mounting. The fan structure is sprung into its vertical position and is withdrawn upon the mounting through the access opening. During withdrawal, the fan structure is pivoted downwards automatically against its spring to allow for its withdrawal in a horizontal as distinct from a vertical position.

5 Claims, 6 Drawing Sheets

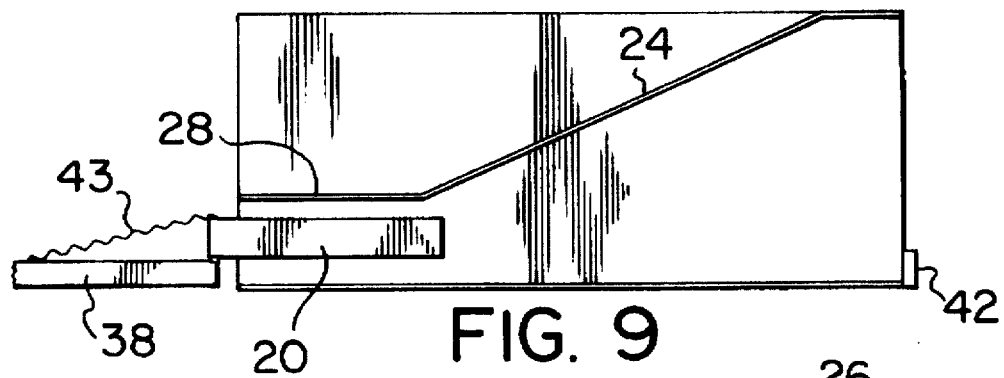
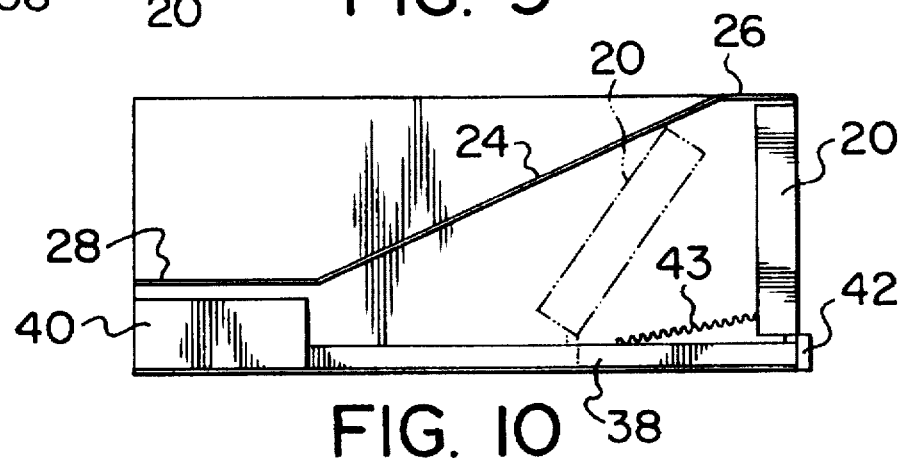
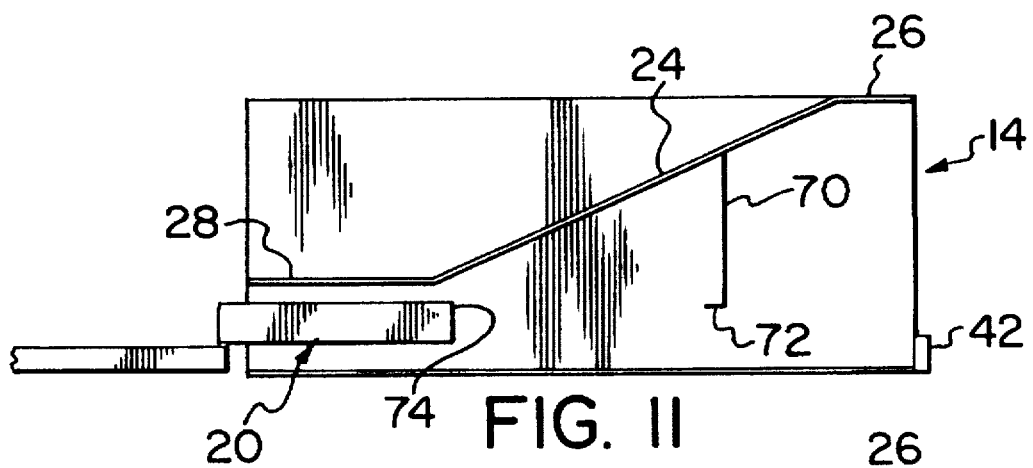
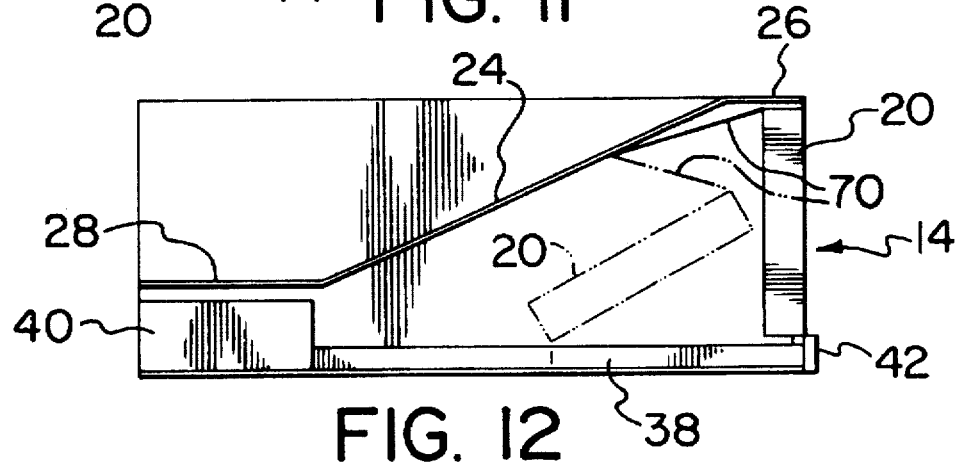

ELECTRONIC EQUIPMENT HAVING AIR FLOW COOLING PASSAGES

This invention relates to electronic equipment having air flow cooling passages.

Electronic equipment generates heat and requires means for heat removal. In particular, certain kinds of electronic equipment include shelves for holding printed circuit boards or circuit packs carrying printed circuit boards, the printed circuit boards being connected into back planes of the shelves. In such arrangements, cooling air is passed or forced vertically through the shelves. Fan structures used for this purpose may be oriented to rotate about vertical or horizontal axes. It is preferred in certain constructions to locate fan structures in air flow passages at the rear of electronic equipment. With these fan located in positions above shelves through which air is to be drawn, the air is drawn upwards through the shelves then over the shelves in a front-to-rear direction of the equipment. Because of this arrangement, the fan structures are mounted for fan rotation about horizontal axes and the parts of an air flow passage above a shelf widens vertically from a restricted front end to a wider rear end. This passage shape serves the purpose of reducing air turbulence and also eliminates stationary air pockets. A problem which results from this, however, is that it is impossible to remove the fan structures from the front of the equipment for replacement or repair.

The present invention seeks to provide electronic equipment which will avoid the above problems.

Accordingly, the present invention provides electronic equipment comprising a housing defining an air flow passage, a fan structure disposed with a vertical orientation in an operating position within the air flow passage, the air flow passage having a restricted access opening to the fan structure at a front of the housing and forwardly of the fan structure in its operating position, the fan being pivotally carried upon a mounting which extends forwardly to the access opening as a fan removal member which is movable forwardly through the access for removal of the fan structure, the fan structure being caused to tilt towards a horizontal orientation during the forward movement so as to enable it to be removed through the restricted access opening, and means being provided to cause the tilted fan structure to assume its vertical orientation as the fan structure is moved rearwardly into its operating position.

With the above equipment, the fan structure, which may lie at the rear of the housing, is easily removed and replaced without interfering with the housing or without moving the equipment to obtain access through the housing rear. In a practical construction, the fan removal member is slidable upon a guide to ensure guidance of the fan structure into its operating position. In addition, the electronic equipment includes a back plane at the rear of the housing and, for the purpose of fan operation, the mounting carries a connector which, as the fan structure moves into its operating position, moves into electrical connection with the back plane.

Preferably, the means to cause the fan structure to assume its vertical orientation is a resilient means which biases the fan structure towards the vertical orientation. In alternative arrangements, the housing is provided with guides which cause the tilted fan structure to move into the vertical orientation, or the structure is engaged by a freely pivoted fan raising member which forms with the fan structure an articulated linkage. Movement of the fan structure towards its operating position causes relative pivoting movement of the interengaged fan raising member and the fan structure until the fan is vertical.

Embodiments of the invention will now be described, by way of example, with reference to the accompanying drawings, in which:

FIG. 1 is a vertical cross-sectional view through part of electronic equipment according to a first embodiment;

FIG. 2, to a larger scale than FIG. 1, is a rear exploded isometric view of a housing for forming part of an air flow passage in the equipment of the first embodiment;

Figure 2:
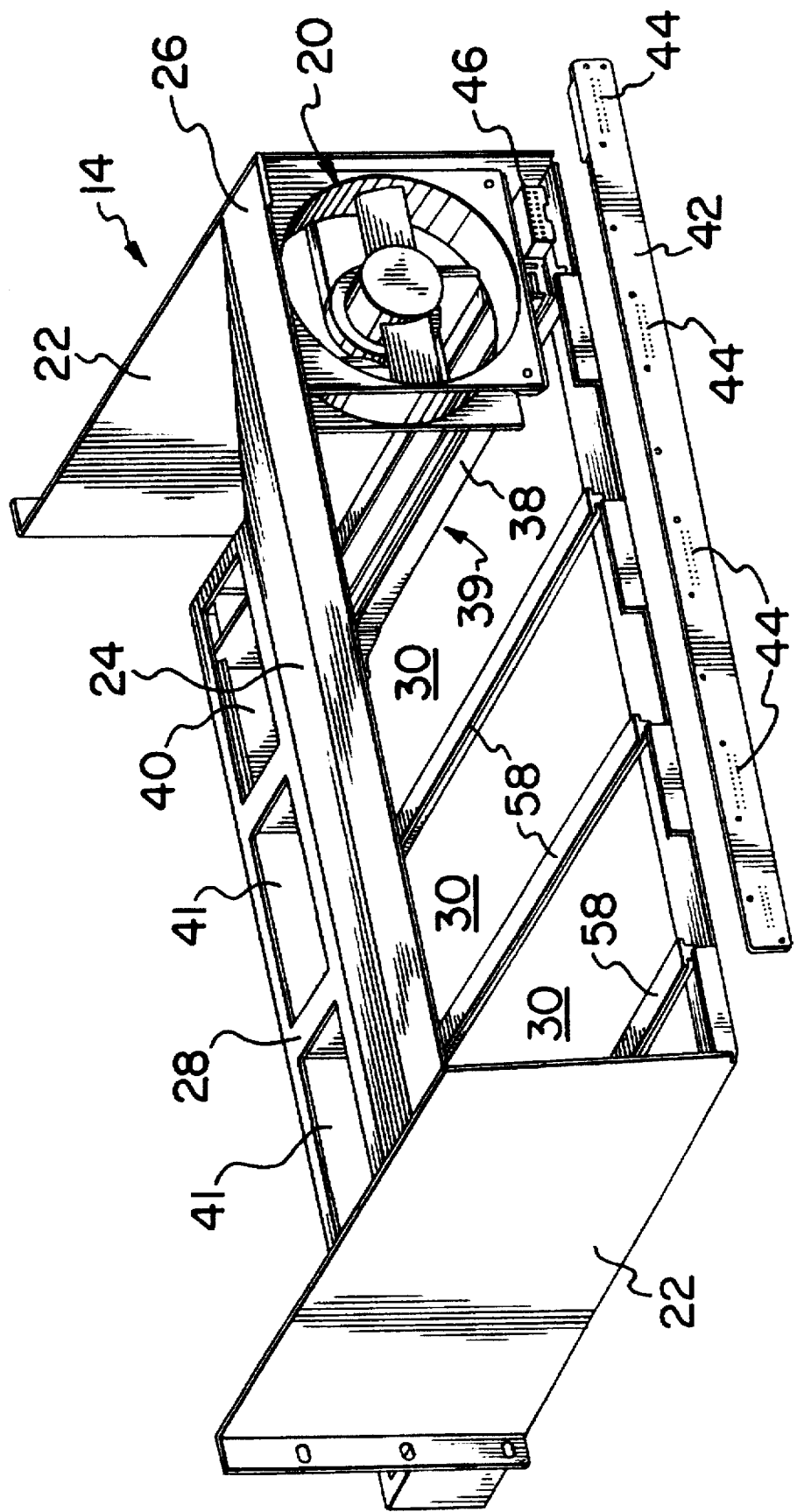

FIGS. 9 and 10 are diagrammatic side elevational cross-sectional views of the housing of FIG. 2, but to a smaller scale, and showing different stages for insertion of the fan structure assembly into the housing; and FIGS. 11 and 12 are views, similar to FIGS. 9 and 10, of a second embodiment.

Figure 1:
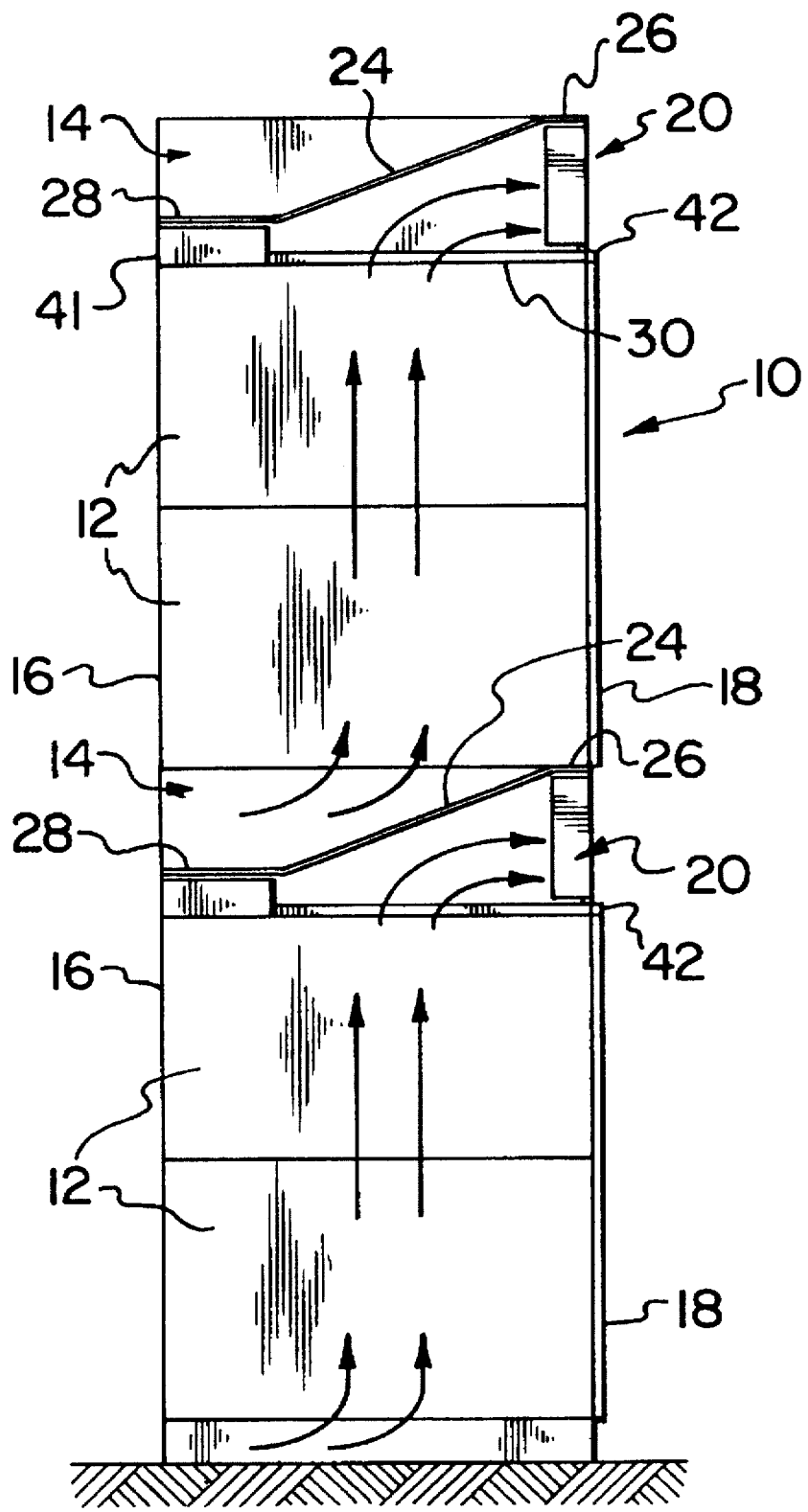

As shown by FIG. 1, in a first embodiment, electronic equipment 10 comprises a plurality of shelves 12 stacked in pairs with adjacent pairs being separated by an air flow passage housing 14. The shelves 12 are provided in normal fashion for the sliding reception through a front 16 of the shelves of side-by-side vertically arranged printed circuit boards (not shown) which, upon full insertion into their respective shelves, come into electrical connection with back planes 18 at the rear of the shelves. Air is drawn vertically through each pair of shelves as indicated by the arrows, by fan structures 20 disposed at the rear of the equipment and mounted within respective housings 14 as will now be described.

As shown in FIG. 2, each of the housings 14 has front-to-rear sides 22 between which extends an inclined top 24 terminating at a rear end of the housing in a narrow horizontal top portion 26. At the front end of the housing as is more clearly shown in FIG. 1, the top 24 at its lower front end extends to the front of the housing as a low horizontal top portion 28. An air flow passage defined between the sides 22 and the top 24 thus increases in height from the front to the rear of the housing 14 for the purpose of reducing air turbulence within this passage and also for reducing or eliminating stationary air pockets in known manner. Air is drawn in through an open bottom 30 of the housing 14 from within the shelves 12 (FIG. 1) to be emitted by the fan structures 20 through the back of the housing indicated by the positions of the fan structures.

Figure 3:
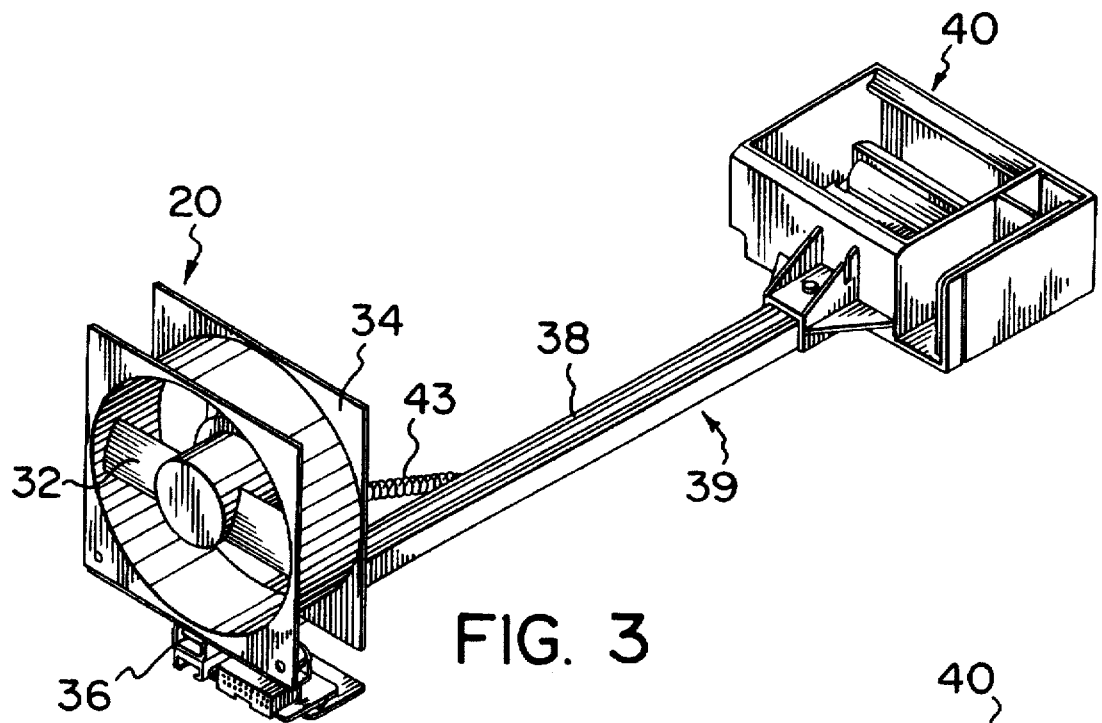
FIG. 3 is a rear isometric view of a fan structure assembly incorporated in the housing of FIG. 2 and to a larger scale than FIG. 2.
Figure 4:
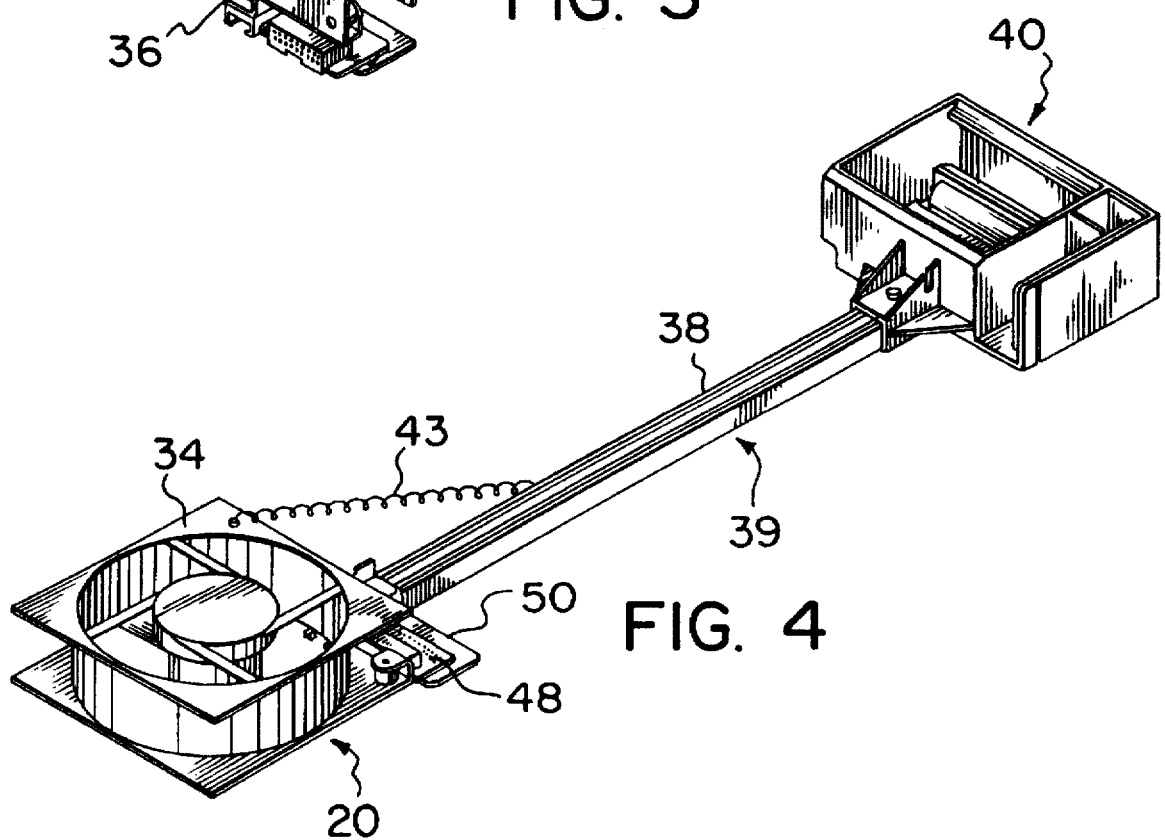
FIG. 4 is a view similar to FIG. 3 of the fan structure assembly showing a fan structure in a different position from FIG. 3.
Figure 5:
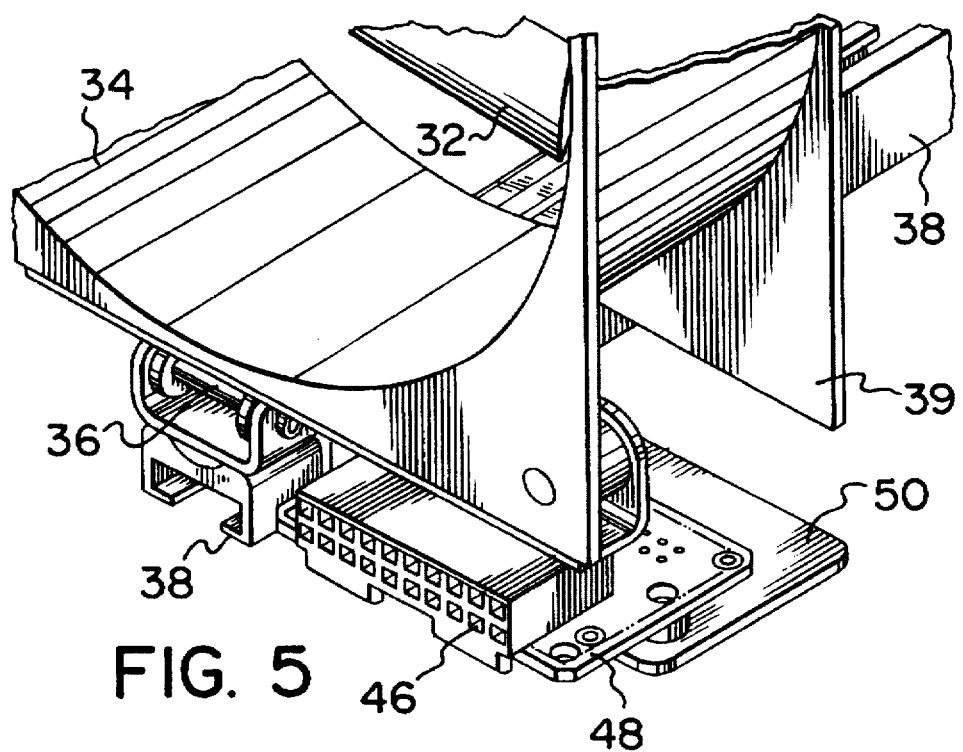
FIG. 5 is a view similar to FIG. 3 of part of the fan structure assembly and to a larger scale.
Figure 6:
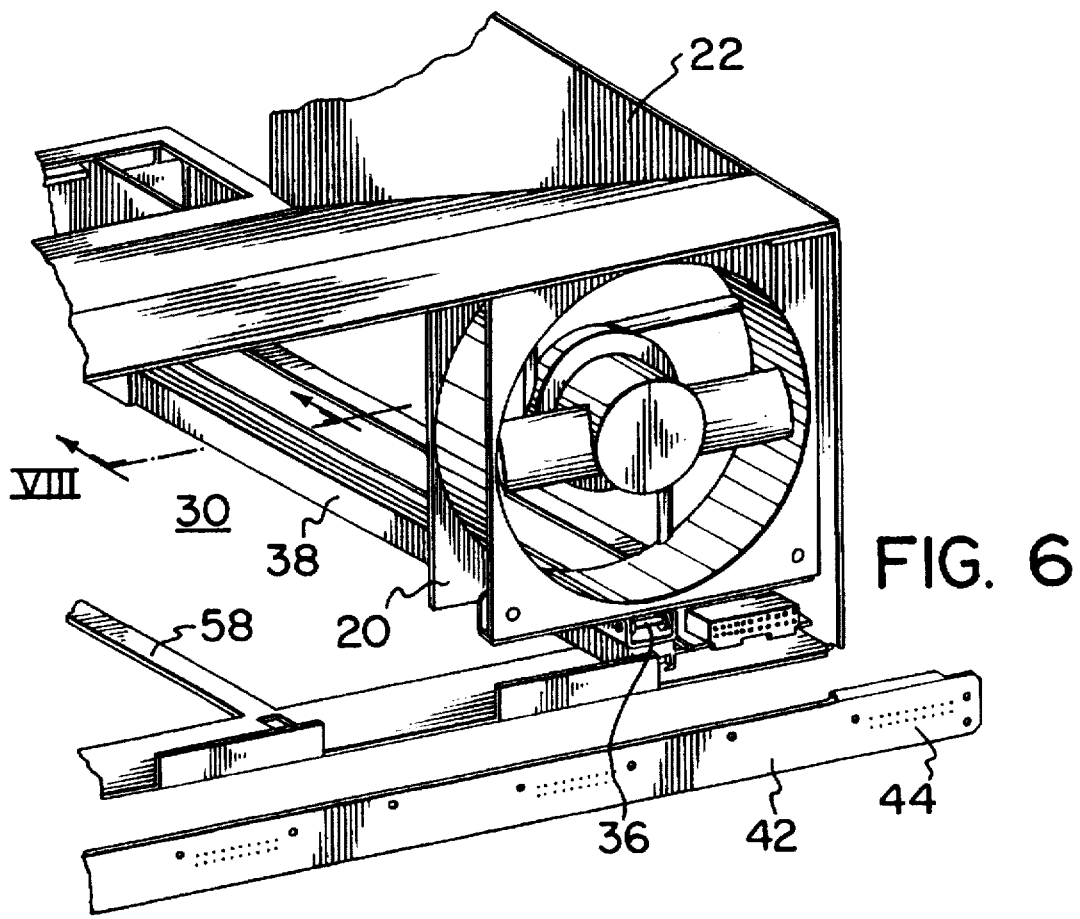
FIG. 6 is a view similar to FIG. 2 and showing part of the housing and a single fan structure assembly in isometric exploded condition.

Each housing 14 has four fan structures 20 mounted side-by-side across its open rear (only one such fan structure 20 is shown in FIG. 2). As shown particularly in FIGS. 3, 4 and 5, each fan structure comprises a fan 32 rotatably mounted within a fan housing 34 which is pivotally mounted along a lower edge by pivot pin 36 to the front end of a mounting which comprises a fan removal member 38. The fan removal member 38 and the fan structure 20 form part of a fan structure assembly 39. The fan removal member 38 is an open-topped channel which extends between the fan structure 20 at one end and a handle structure 40 at the other end. The handle structure 40 is of rectangular shape in front elevation so as to fit below the top portion 28 of the housing 14 within an access opening 41 defined by the housing. The access opening 41 is slightly larger than the handle structure 40 to provide a gap for air into the air passage within the housing. The fan structure 20 is held normally in a vertical orientation, i.e. normal to the length of the removal member 38 as shown by FIG. 3, by a tension spring 43 (see FIG. 4 particularly) which extends from a suitable position on the housing 34 to a fixed location along the length of the removal member 38. The fan structure 20 may be pivoted from its vertical orientation into a horizontal orientation, as shown by FIG. 4 against spring tension, but will return to its vertical orientation automatically as soon as the holding down pressure is removed.

Figure 7:
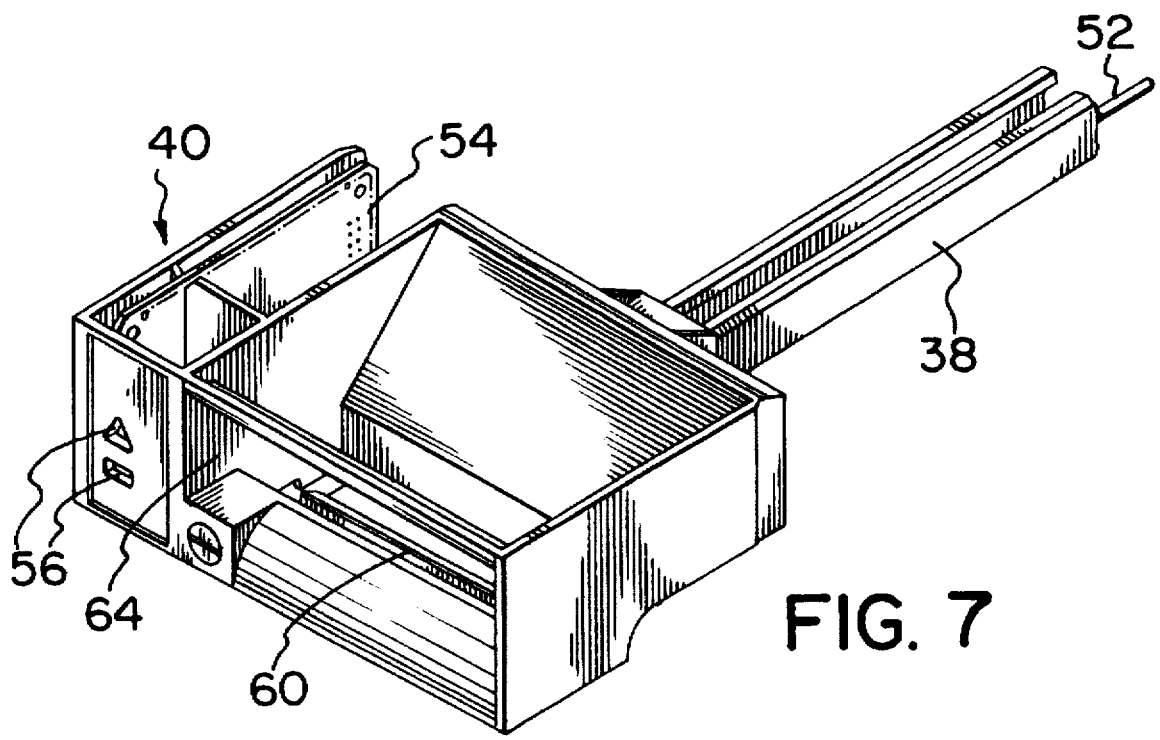
FIG. 7 is a front isometric view of the front end of the fan structure assembly.
Figure 8:
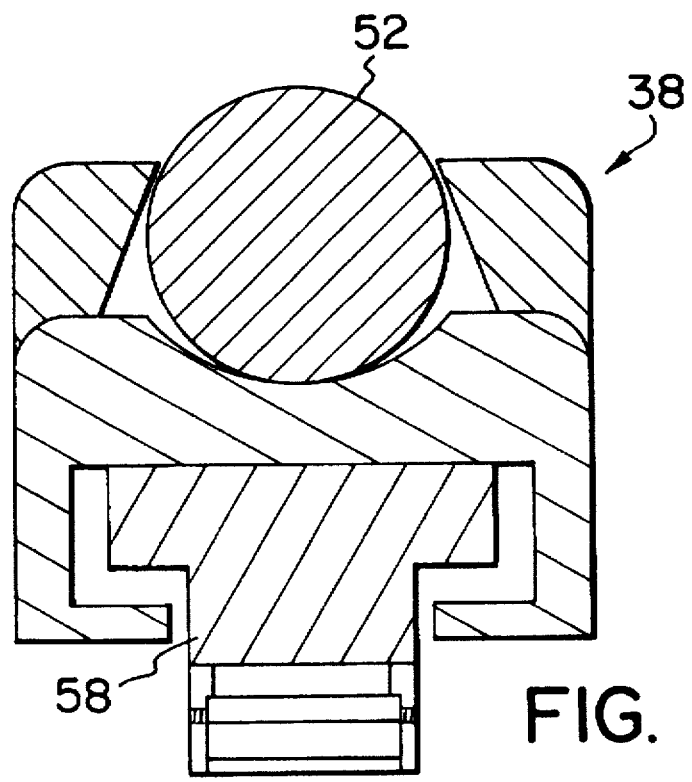
FIG. 8 is a cross-sectional view taken along line VIII—VIII in FIG. 6 and to a larger scale.

As shown in FIG. 2, the housing 14 is provided with a vertically narrow back plane 42 extending between the sides 22. This back plane 42 has four groups of terminals 44 each for a connection to an associated connector 46 which is mounted upon a printed circuit board 48 carried upon a platform 50 secured to the removal member 38 (see also FIG. 5). The position of each connector 46 is such as to lie beneath the fan housing 34 in its vertical orientation (FIGS. 3 and 5) and so as to be connected into associated terminals 44 in the back plane 42 with the fan structure in its rear operating position shown in FIGS. 1 and 2. The connector 46 in each case is operatively connected to its fan 32 by a short flexible cable (not shown). In addition, a further cable 52 (FIGS. 7 and 8) extends within the removal member 38 to a printed circuit board 54 mounted in the handle structure 40, the printed circuit board 54 being provided at least partly to control operation of an LED arrangement 56 facing forwardly from the handle 40. LED 56 is used at least for the purpose of indicating when its associated fan is no longer operative. The cable 52 is held in position by converging sides of the removal member 38 (FIG. 8).

As may be seen from FIGS. 1 and 2, the fan structure 20, in the operating position at the rear of the housing 14, has a vertical height which substantially fills the space beneath the top portion 26 of the housing. With the electronic equipment 10 disposed in such a position that it would be impossible to have access to any fan 32 from the back of the equipment, then each fan structure must be pivoted down to the FIG. 4 position for removal from the front access opening 41. In the FIG. 4 horizontal orientation, the height of the housing 34 is such as to enable the fan structure to be removed through its access opening 41.

In use of the equipment, each of the fan structure assemblies 39 is mounted in its respective operating position at the rear of its housing 14 by sliding reception of the removal member 38 along a guide of the housing provided by a fixed guide element 58 (FIGS. 2 and 8) extending from front-to-rear of the housing and across the open bottom 30. To insert each of the assemblies 39, the fan structure 20 is held downwards to the FIG. 4 orientation against the influence of the spring 43 and is fed into the front of the housing 14 as shown in FIG. 9. As insertion proceeds, the fan structure 20 is maintained in its horizontal orientation as it passes beneath the top portion 28 of the housing. However, as the fan structure proceeds beneath the inclined top 24 it is permitted to pivot upwards under the influence of its tension spring 43 with the top corner of the housing engaged against the lower surface of the top 24. This is illustrated by the chain-dotted position of the fan structure 20 in FIG. 10 in which the structure has been moved partly towards its full operating position shown in full outline at the rear of the housing. Upon the fan structure being moved sufficiently far to the rear that it is disposed beneath the top portion 26 it immediately is brought into its vertical orientation and the connector 46 is electrically mated with the terminals 44. Should the fan 32 cease to operate, this is indicated by a warning signal of the LED 56 and the handle 40 is used to withdraw the total assembly from within the housing 14 by reversing the movement from FIG. 10 to FIG. 9. This movement is accompanied by tilting the fan structure downwardly to its horizontal orientation by contact with the inclined top 24 of the housing 14.

In the operating position of the fan structure, the handle 40 has a locking detent (not shown) which extends downwardly from it into a detent receiving slot in the housing 14. Withdrawal of the handle 40 is permitted by manual depression of a lever 60 which removes the detent from within its slot thereby freeing the handle. Above the lever 60 a frontal opening 64 is provided in the handle 40 for entrance of additional air into the air passage of the housing 14 under the drawing power of the fans 32 so as to ensure complete evacuation of the air drawn through the open bottom 30 and avoid any localized stationary air pockets or air turbulence.

As shown by the above embodiment, withdrawal and insertion of a vertically operative fan structure is provided through a restricted frontal opening to the equipment thereby rendering a simple and quick operation where the rear of the equipment is inaccessible. The construction also ensures automatic electrical connection into the circuitry of the equipment as the fan structure is moved into its operating position.

In a second embodiment as shown by FIGS. 11 and 12, it is unnecessary for the use of a resilient means to move the fan structure 20 into a vertical position.

In the second embodiment in which parts of similar construction to those in the first embodiment bear the same reference numerals, each fan structure 20 is caused to pivot upwards as it approaches its operating position by a freely pivoted fan raising member. This fan raising member which may be in the form of separated spaced apart links, or in the form of a downwardly freely pivoted plate 70 as shown. The plate 70 is shaped at its lower end for engaging the upper edge of the fan structure as it is moved into the housing 14 so as to maintain engagement with the structure during fan insertion. For this purpose, the lower edge of the plate 70 may be turned in a forward direction as shown at 72 so as to engage beneath the upper forward edge 74 of the fan structure. As the fan structure is inserted in its tilted down horizontal orientation at the left-hand side of FIG. 11, it is moved forwardly until the edge 72 of the plate 70 engages beneath the top corner 74 of the structure. This is shown in chain-dotted outline in FIG. 12. As the structure is then moved rearwardly further, the plate and the fan structure are maintained together in the form of an articulated linkage with the effect that the plate pivots upwardly in an anti-clockwise direction while at the same time drawing the leading end of the fan structure upwardly and around the pivot point of the plate. This upward movement continues until, in the final operating position of the fan structure as shown in full outline at the right of FIG. 12 the fan structure has been pivoted to its vertical orientation. Then, the plate 70 extends rearwardly from its pivot point to the corner 74 with which it is still maintained in engagement. Upon the structure being removed from within the housing, the handle 40 draws the fan structure away from the operating position and causes it to tilt downwardly towards its horizontal orientation while removing it from the plate 70 which again returns under gravity to its vertical freely pivoted hanging position.

What is claimed is:

1. Electronic equipment comprising a housing having a front and a rear and defining an air flow passage extending from the front to the rear of the housing, a fan structure assembly disposed in an operating position within the air flow passage, the air flow passage having a restricted access opening to the fan structure assembly at the front of the housing, the fan structure assembly comprising in combination a fan mount and a fan rotatably mounted above a rotational axis to the fan mount which is disposed at the rear of the air flow passage, and the fan structure assembly also including a fan removal member with the fan mount being pivotally carried upon the fan removal member which extends forwardly from the fan mount to the access opening to enable the fan structure assembly to be removed through the access opening, the fan mount, in the operating position, holding the fan with its rotational axis extending in a horizontal direction and with the combination of fan mount and fan extending vertically beyond the access opening;

means operable during removal of the fan structure assembly through the access opening to cause the fan mount to pivot in one direction upon the fan removal member so as to move the rotational axis of the fan towards a vertical orientation, to enable the combination of fan mount and fan to be removed through the restricted access opening; and means operable during return of the fan structure assembly into the operating position to cause the fan mount to pivot in the opposite direction upon the fan removal member so as to cause the fan to return its rotational axis to the horizontal direction.

2. Electronic equipment according to claim 1 wherein the fan removal member is slidably mounted upon a guide provided by the housing to ensure guidance of the fan structure assembly into its operating position.

3. Electronic equipment according to claim 2 provided with a back plane extending across the rear of the housing, and the fan removal member carries a connector which, as the fan structure assembly moves into its operating position, is brought into electrical connection with the back plane.

4. Electronic equipment according to claim 2 wherein the means to cause the fan mount to pivot in the opposite direction comprises a resilient means which biases the fan mount to pivot in the opposite direction.

5. Electronic equipment according to claim 2 wherein the means to cause the fan mount to pivot in the opposite direction comprises a freely pivoted fan raising member carried by the housing within the air passage, the fan raising member engaged by the fan mount as the mount is moved rearwardly towards the operating position so as to form with the fan mount an articulated linkage, further rearward movement of the fan mount towards the operating position thereby causing relative pivoting movement of the fan mount and the fan raising member until the fan is in position with its axis extending in the horizontal direction.

* * * * *